(12) United States Patent
Engelen et al.

(10) Patent No.: US 10,673,208 B2
(45) Date of Patent: Jun. 2, 2020

(54) ARRAY OF LIGHT SOURCES COMPRISING MULTIPLE VCSELS

(71) Applicant: Lumileds LLC, San Jose, CA (US)

(72) Inventors: Rob Jacques Paul Engelen, Eindhoven (NL); Nicola Bettina Pfeffer, Eindhoven (NL); Arjen Van Der Sijde, Eindhoven (NL)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/487,386

(22) PCT Filed: Feb. 14, 2018

(86) PCT No.: PCT/EP2018/053660
§ 371 (c)(1),
(2) Date: Aug. 20, 2019

(87) PCT Pub. No.: WO2018/153744
PCT Pub. Date: Aug. 30, 2018

(65) Prior Publication Data
US 2020/0014174 A1    Jan. 9, 2020

(30) Foreign Application Priority Data
Feb. 21, 2017   (EP) ..................................... 17157130

(51) Int. Cl.
*H01S 5/183*      (2006.01)
*H01S 5/042*      (2006.01)
(Continued)

(52) U.S. Cl.
CPC ...... *H01S 5/18394* (2013.01); *H01S 5/02208* (2013.01); *H01S 5/04252* (2019.08);
(Continued)

(58) Field of Classification Search
CPC .. H01S 5/02208; H01S 5/423; H01S 2301/18; H01S 5/1225; H01S 5/18386;
(Continued)

(56) References Cited

U.S. PATENT DOCUMENTS

| | | | |
|---|---|---|---|
| 2005/0152430 A1* | 7/2005 | Onishi | ................ H01S 5/18394 372/92 |
| 2006/0098706 A1* | 5/2006 | Sato | ..................... H01S 5/18394 372/50.124 |

(Continued)

FOREIGN PATENT DOCUMENTS

EP         2366549 A2      9/2011

OTHER PUBLICATIONS

Matsuo S. et al: "Use of Polyimide Bonding for Hybrid Integration of a Vertical Cavity Surface Emitting Laser on a Silicon Substrate", Electronics Let, IEE Stevenage, GB, vol. 33, No. 13, Jun. 19, 1997, pp. 1148-1149, XP006007611, ISSN: 0013-5194, DOI: 10.1049/EL:19970752 figures 1, 2.

(Continued)

*Primary Examiner* — Tuan N Nguyen
(74) *Attorney, Agent, or Firm* — Volpe and Koenig, P.C.

(57) ABSTRACT

The invention describes an array of light sources comprising multiple VCSELs arranged laterally to each other on top of a substrate, wherein each VCSEL comprises a light emitting area surrounded by an electrode structure which does not emit light, wherein a shielding layer is applied on top of at least the electrode structure only covering a surface (of the electrode structure facing towards an average light emitting direction of the VECSELs, the shielding layer is an opaque layer and being adapted to optically match the array in a switched-off state to an outer surface of a housing of a device, where the array of light sources is to be installed. The invention further describes the device comprising such an (Continued)

array and a method for manufacturing an array of light sources.

14 Claims, 4 Drawing Sheets

(51) Int. Cl.
    *H01S 5/022*     (2006.01)
    *H01S 5/42*     (2006.01)

(52) U.S. Cl.
    CPC ........ *H01S 5/423* (2013.01); *H01S 2301/176* (2013.01); *H01S 2301/18* (2013.01)

(58) Field of Classification Search
    CPC .... H01S 2302/02; H01S 5/0425; H01S 5/028; H01S 5/3402
    USPC ..................................... 372/50.124
    See application file for complete search history.

(56) References Cited

U.S. PATENT DOCUMENTS

2012/0120977 A1*   5/2012  Fattal ................. H01S 5/18363
                                                         372/50.11
2015/0288145 A1*  10/2015  Fattal ................. H01S 5/18363
                                                         372/45.01

OTHER PUBLICATIONS

Ueki N et al: "Complete Polarization Control of 12 X 8-Bit Matrix-Addressed Oxide-Confined Vertical-Cavity Surface-Emitting Laser Array", Japanese Journal of Applied Physics, Japan Society of Applied Physics, JP, vol. 40, No. 1 A/B. Part 02, Jan. 15, 2001 (Jan. 15, 2001), pp. L33-L35, XP001001707, ISSN: 0021-4922, D0I: 10.1143/JJAP.40.L33 figure 1.

* cited by examiner

ARRAY OF LIGHT SOURCES COMPRISING MULTIPLE VCSELS

FIELD OF THE INVENTION

The invention relates to an array of light sources, a device comprising such an array and a method for manufacturing an array of light sources.

BACKGROUND OF THE INVENTION

Separately packaged infrared (IR) and visible light emitters have been used in a variety of applications, including photography, spectral or hyperspectral analysis, 3D sensing, and communication. The layout, material, or design of the IR emitters, optics, or package can affect overall appearance of a carrying device when being installed in this device.

It would be desirable to obtain device components, especially IR emitter modules, being visible from the environment not disturbing the overall optical appearance of devices carrying these components which might be of particular interest in consumer applications.

SUMMARY OF THE INVENTION

It is an object of the present invention to provide a device component, especially an IR emitter module, with an optical appearance match to the overall optical appearance of a device carrying this component. An array of light sources comprising multiple vertical cavity surface emitting lasers, so-called VCSELs, is an IR emitter module. A simple design for a VCSEL array can be improved if the VCSEL appearance allows for color changes to provide a more uniform appearance of the carrying device.

The invention is defined by the independent claims The dependent claims define advantageous embodiments.

According to a first aspect an array of light sources is provided. The array of light sources comprises multiple VCSELs arranged laterally to each other on top of a substrate, wherein each VCSEL comprises a light emitting area surrounded by an electrode structure which does not emit light, wherein a shielding layer is applied on top of at least the electrode structure covering at least a surface of the electrode structure facing towards an average light emitting direction of the VCSELs, the shielding layer being adapted to optically match the array in a switched-off state, where no light is emitted, to a demanded appearance. Here the term "applied on top of" denotes the direct coating of a layer on top of another layer or component as well as a coating applied above another layer or component, where additional material layers might be arranged in between. In an embodiment the shielding layer being adapted to optically match the array in a switched-off state to an outer surface of a housing of a device, where the array of light sources is to be installed.

The vertical-cavity surface-emitting laser or VCSEL is a type of semiconductor laser diode with laser beam emission perpendicular from the top surface, contrary to conventional edge-emitting semiconductor lasers (also in-plane lasers) which emit from surfaces formed by cleaving the individual chip out of a wafer. The laser resonator of a VCSEL consists of two distributed Bragg reflector (DBR) mirrors parallel to the wafer surface with an active region consisting of one or more quantum wells for the laser light generation in between. VCSELs for wavelengths from 650 nm to 1400 nm are typically based on gallium arsenide wafers with DBRs formed from GaAs and aluminum gallium arsenide. Longer wavelength devices, from 1400 nm to 2000 nm, have been demonstrated with at least the active region made of indium phosphide. The light emitting area is typically arranged in the center of the emitting surface of the DBR mirrors, where the top electrode is arranged as a metal layer on top of the DBR mirror, typically made of gold. The VCSEL emits light with an average light emitting direction perpendicular to the DBR mirrors, where the light emitting area is small in comparison to the surface of the surrounding electrode structure leading to an optical appearance dominated by the appearance of the electrode material. The ratio between light-emitting area and electrode structure is far below 50%, e.g. 20-30%. Therefore VCSEL arrays typically have a golden appearance which does not match to the common appearance of device housings. In contrast to the electrode structures the light emitting areas of VCSELs have a dark color appearance when being switched of.

The applied shielding layer covers at least the electrode structure in order to prevent light from being reflected from the electrode structure or at least modifies the light being reflected from the electrode structure to provide a desired optical appearance. Eventually the shielding layer covers all non-light-emitting areas of the array of light sources. Therefore the shielding layer is a non-transparent layer being either opaque or semi-transparent at least with the visible range of the wavelength spectrum of light. The shielding layer may be of any material having e.g. a white, black or colored appearance. As an example, the shielding layer might be a silver layer, a chrome layer, a layer comprising phosphor particles or an ink layer, where the particular phosphor particles or inks are selected depending on the desired appearance. The electrode structure does not actively emit light. The electrode structure only absorbs or reflects light from the environment.

The laterally arranged VCSELs provide a lateral array of VCSELs, where the VCSELs are arranged side-by-side of each other. The term "lateral" denotes the extension of the arrangement of VCSELs parallel to the light emitting areas of the VCSELs.

The array of light sources may be arranged in such a way that all visible surfaces of the electrode structure are coated by the shielding layer. In this case the overall appearance of the array can be adapted without influence of any non covered part of the array. The term "visible" denotes all surfaces contributing to the overall optical appearance of the array of light sources to the environment.

The array of light sources may be arranged in such a way that the array of light sources comprise non-active areas between neighbored VCSELs, where the shielding layer also covers the non-active areas. The non-active areas might be parts of the substrate not covered by the VCSELs arranged on top of the substrate. The shielding layer covering the non-active areas prevents any influence of the substrate on the overall optical appearance of the array.

The array of light sources may be arranged in such a way that the non-active areas define volumes between neighbored VCSELs, where at least the volumes are suitably filled by a filler material to provide a smooth surface between neighbored VCSELs to be coated with the shielding layer. The arrangement of VCSELs provide a structured non-flat surface, which is difficult to be coated with a homogeneous coating in order to influence the optical properties of the outer surface of the array of light sources for matching the overall appearance of the array. When filling the volumes (gaps) a smooth and flat surface can be provided in between the light-emitting areas which can be coated with the shielding layer more easily with an improved homogeneity of this layer. The flat (smooth) surface denotes a surface with a significantly lower height difference between highest and lowest point of the surface compared to a corresponding surface without filled volumes. Significantly lower means at least a factor of ten lower.

The array of light sources may be arranged in such a way that the filler material fills out at least one volume to a highest distance of the electrode structures of the neighbored VCSELs above the substrate. This especially provides a flat surface outside the light emitting area of the VCSELs which can be easily coated with the shielding layer providing homogeneous optical properties and a good adhesion to the coated surface.

The array of light sources may be arranged in such a way that the filler material is a photoresist material. The photoresist material can be applied and structured easily in order to cover the light emitting areas of the VCSELs. The use of photoresist material enables a coating process for the filler material without required masks to shield the light emitting areas of the VCSELs. After coating the filled material can be stabilized in non-light-emitting areas by suitable laser treatment. The photoresist material not being laser treated can be simply removed, e.g. by a suitable washing process.

The array of light sources may be arranged in such a way that the shielding layer has an absorption or reflection spectrum within the visible wavelength range being different from the corresponding absorption or reflection spectrum of a material of the electrode structure. In order to modify the overall appearance of the non-coated electrode structures, these structures have to be coated with a material modifying the optical properties of the resulting layer stack. Therefore the optical properties of the shielding layer must be different compared to the optical properties electrode structure where the material of the electrode structure might be gold. As an example, not being part of the invention, the shielding layer might be non transparent, so the color of the electrode structure is not visible. If the shielding layer is semi-transparent the electrode structure is partially visible. In this case the optical appearance of the shielding layer is adapted to counteract the spectral absorption of the electrode. For electrode structures made of gold (absorbing blue light), a shielding layer with green and red absorption will result in an overall optical appearance of electrode structure and shielding layer being white or grey. Layer materials providing such appearances are known.

As an example, not being part of the invention, the array of light sources may be arranged in such a way that the thickness of the shielding layer is adapted to be semitransparent for at least visible light and to provide an optical appearance in combination with the electrode structure underneath the shielding layer matching to the outer surface of the housing of the device. Depending on the material of the electrode structure and the material of the shielding layer, the thickness can be adapted to shift the optical appearance of the resulting array from an appearance close to the appearance of non-coated electrode structured to an appearance to the shielding layer itself regardless of the electrode material underneath.

According to a second aspect a device comprising at least one array of light sources in accordance with any embodiment described above is provided. The device further comprises a housing with an outer surface where the shielding layer optically matches the array in a switched-off state to the outer surface. Such a device provides an overall homogeneous optical appearance. The term "device" may denote tablet PCs, laptop, cameras or mobile communication devices such as smartphone, cell phones or PDAs where a certain appearance (e.g. black, white, specifically colored or mirror-like) to the environment is desired.

According to a third aspect a method to manufacture an array of light sources in accordance with any embodiment described above is provided. The method comprises the steps of Arranging multiple VCSELs on top of a substrate in an lateral array, where each VCSEL comprises a light emitting area surrounded by an electrode structure which does not emit light;

Applying a shielding layer at least on top of the electrode structure to cover at least a surface of the electrode structure facing towards an average light emitting direction of the VECSELs in order to optically match the array in a switched-off state to a demanded appearance.

The process for applying the shielding layer on top of the electrode structure can be any suitable process, e.g. a masking process shielding the light-emitting area of the VCSELs during deposition. Alternatively to the masking process or in support of the masking process a photoresist deposition process followed by laser hardening of the photoresist material and washing off the non-hardened areas may be used to shield or fill up different areas depending on the embodiment of the used process to apply the shielding layer. There are positive and negative photoresist available. Depending on which material is used, the light-exposed area stays or is removed when developing the photoresist layer. In an embodiment the shielding layer being adapted to optically match the array in a switched-off state to an outer surface of a housing of a device, where the array of light sources is to be installed.

The method may be arranged in such a way that wherein prior to the step of applying the shielding layer the method further comprises the steps of covering the light-emitting areas with a photoresist material before applying the shielding layer; and washing away the photoresist layer covering the light-emitting areas after having applied the shielding layer in order to remove any material on top of the light-emitting areas.

The method may be arranged in such a way that the step of applying the shielding layer will also coat non-active areas within the array located between neighbored VCSELs.

The method may be arranged in such a way that prior to the step of applying the shielding layer the method further comprises the step of suitably filling volumes between neighbored VCSELs defined by the non-active areas by a filler material to provide a smooth surface between neighbored VCSELs to be coated with the shielding layer.

The method may be arranged in such a way that suitable filling denotes the filling of at least one volume to a highest distance of the electrode structures of the neighbored VCSELs above the substrate.

The method may be arranged in such a way that the step of applying the shielding layer is performed via a mask-less electrophoretic deposition process in order to locally deposit the shielding layer on top of the electrode structure. During this process the array of VCSELs is arranged in a wet solution comprising the material of the shielding layer to be deposited on top of the electrode structure and electrical field is applied between solution and VCSEL electrodes. The electrical field directs the to-be-deposited material to the areas with a high electrical field density, which is located above the electrode structures. The electrode structures especially are the to-be-coated areas in order to be able to match the optical appearance of the array of light sources to a required appearance. Therefore the material of the shielding layer is mainly or exclusively deposited on top of the electrode structure leaving the light-emitting areas of the VCSELs uncoated. With this electrophoretic process the VCSELS can be locally coated without applying a mask process or a layer hardening process. Therefore the electrophoretic deposition process requires less effort compared to alternative deposition processes.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of an array of VCSELs in a top view without applied shielding layer.

FIG. 2 shows a principal sketch of a VCSEL of the array of VCSELs in a side view with applied shielding layer on top of the electrode structure.

FIG. 3 shows a principal sketch of an array of VCSELs in a side view with filled volumes between neighbored VCSELs (a) before applying the shielding layer and (b) with applied shielding layer on top of a flat surface provided by the filler material.

FIG. 4 shows a principal sketch of a device comprising the array of light sources according to the present invention.

FIG. 5 shows a principal sketch of an embodiment of the method according to the present invention.

In the Figures, like numbers refer to like objects throughout. Objects in the Figs. are not necessarily drawn to scale.

DETAILED DESCRIPTION OF EMBODIMENTS

Various embodiments of the invention will now be described by means of the Figures.

Figure 1:
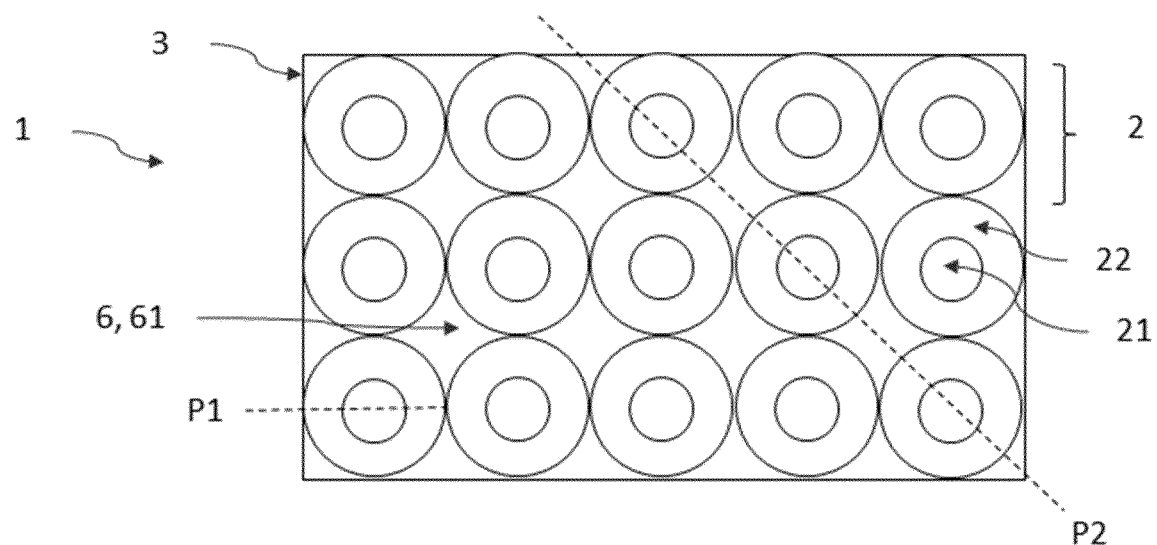

FIG. 1 shows a principal sketch of an array 1 of VCSELs 2 in a top view without applied shielding layer 4. The array 1 of light sources 1 comprising multiple donut shaped VCSELs 2 arranged laterally to each other on top of a substrate 3, wherein each VCSEL 2 comprises a light emitting area 21 surrounded by an electrode structure 22 which does not emit light. The array of light sources 1 comprises non-active areas 6 (approximately between neighbored VCSELs 2 defining volumes 61 between neighbored VCSELs 2. In other embodiments covered by the present invention, the arrangement might by different to the arrangement shown in FIG. 1. The VCSELs 2 in the shown array 1 are arranged side-by-side of each other resulting in a lateral arrangement of the VCSELs 2, where the lateral extensions of the array 1 denote the extensions parallel to the light emitting areas 21 of the VCSELs 2. In this example the VCSELs 2 have a lateral extension of 0.5 mm×0.5 mm and a height above the substrate 3 of 0.2 mm.

Figure 2:
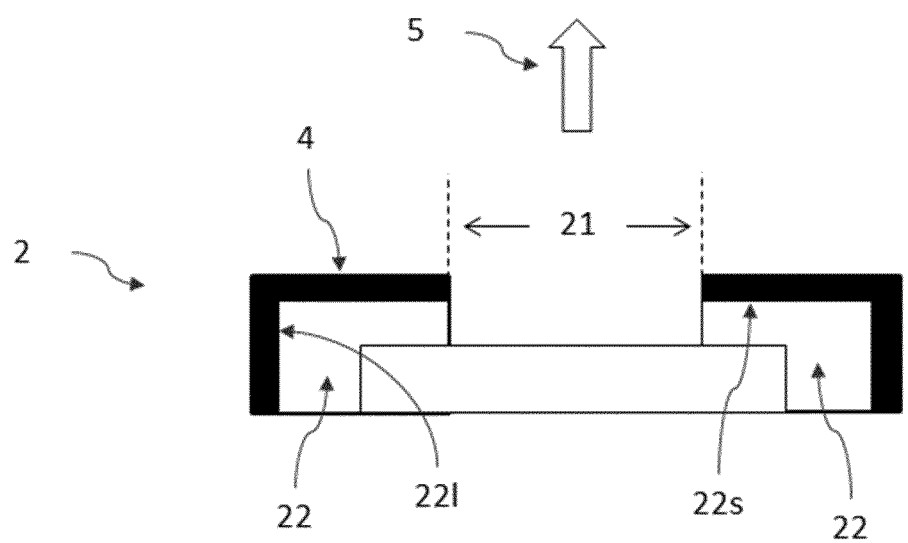

FIG. 2 shows a principal sketch of a VCSEL 2 of the array 1 of VCSELs 2 in a side view with applied shielding layer 4 on top of the electrode structure 22 covering all visible surfaces 22s, 22l of the electrode structure 22 are coated by the shielding layer 4. The side view is along the plane P1 as indicated in FIG. 1. In other embodiments only a surface 22s of the electrode structure 22 facing towards an average light emitting direction 5 of the VECSELs 2 might be coated. The shielding layer 4 is adapted to optically match the array 1 in a switched-off state, where no light is emitted, to an outer surface 11s of a housing 11 of a device 10, where the array 1 of light sources is to be installed (see also FIG. 4). The shielding layer 4 has an absorption or reflection spectrum within the visible wavelength range being different from the corresponding absorption or reflection spectrum of a material of the electrode structure 22. In an embodiment the material of the electrode structure 22 is gold. The thickness of the shielding layer 4 can be adapted to be semitransparent for at least visible light and to provide an optical appearance in combination with the electrode structure 22 underneath the shielding layer 4 matching to the outer surface 11s of the housing 11 of the device 10.

Figure 3:
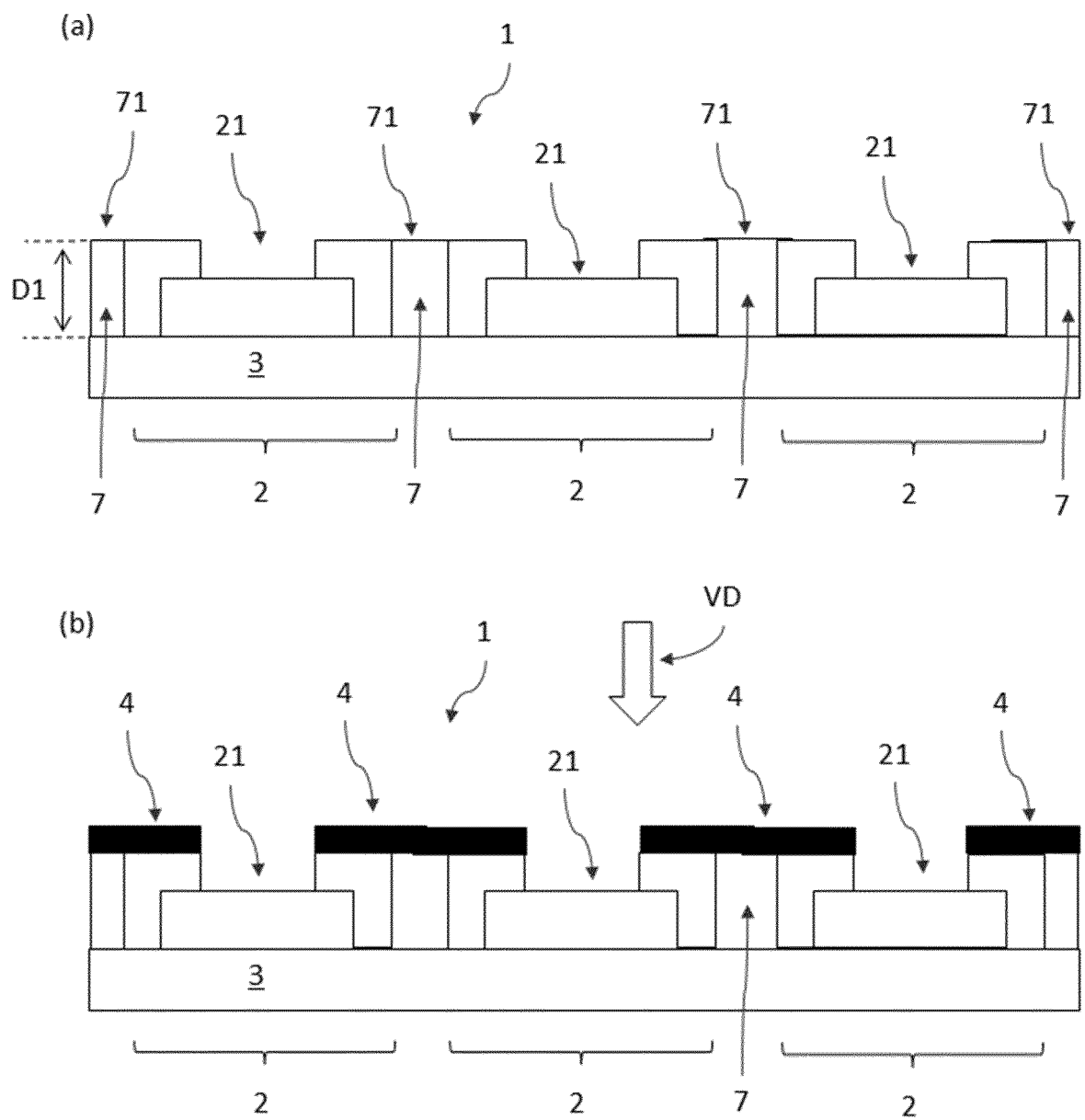

FIG. 3 shows a principal sketch of an array 1 of VCSELs 2 in a side view with filled volumes 61 between neighbored VCSELs 2 (a) before applying the shielding layer 4 and (b) with applied shielding layer 4 on top of a flat surface 71 provided by the filler material 7. The side view is along the plane P2 as indicated in FIG. 1. The non-active areas 6 define volumes 61 between neighbored VCSELs 2, which are filled by a filler material 7 to provide a flat (smooth) surface 71 between neighbored VCSELs 2 to be coated with the shielding layer 4. The flat surface 71 denotes a surface with a significantly lower height difference between highest and lowest point of the surface 71 compared to a corresponding surface without filled volumes 61. Significantly lower means at least a factor of ten lower. Here the filler material 7 fills up the entire volume 61 to a highest distance D1 of the electrode structures 22 of the neighbored VCSELs 2 above the substrate 3. In this embodiment the filler material 7 is a photoresist material. In FIG. 3b the flat surface 71 is coated directly with the shielding layer 4 on top of the flat surface 71. The viewing direction VD indicated from which side a viewer (not shown here) may look onto the array 1 provided a corresponding appearance to the viewer.

Figure 4:
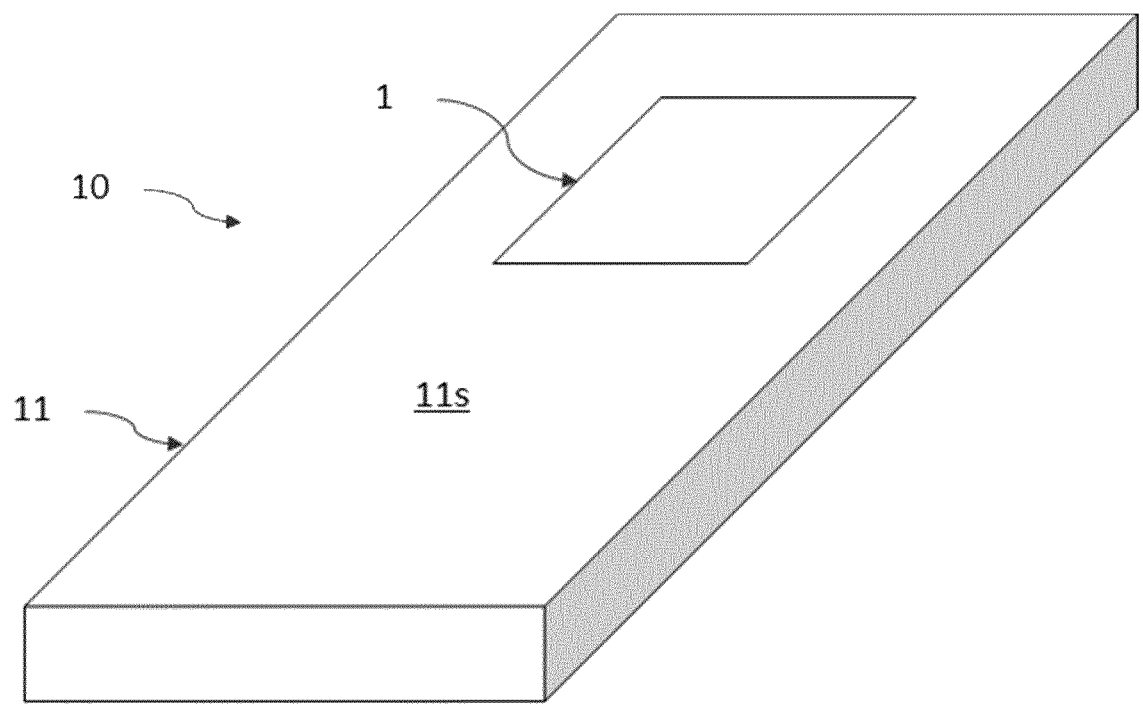

FIG. 4 shows a principal sketch of a device 10 comprising the array of light sources 1 according to the present invention. The device 10 comprises one array of light sources 1 and a housing 11 with an outer surface 11s, where the shielding layer 4 optically matches the array 1 in a switched-off state to the optical appearance of the outer surface 11s.

Figure 5:
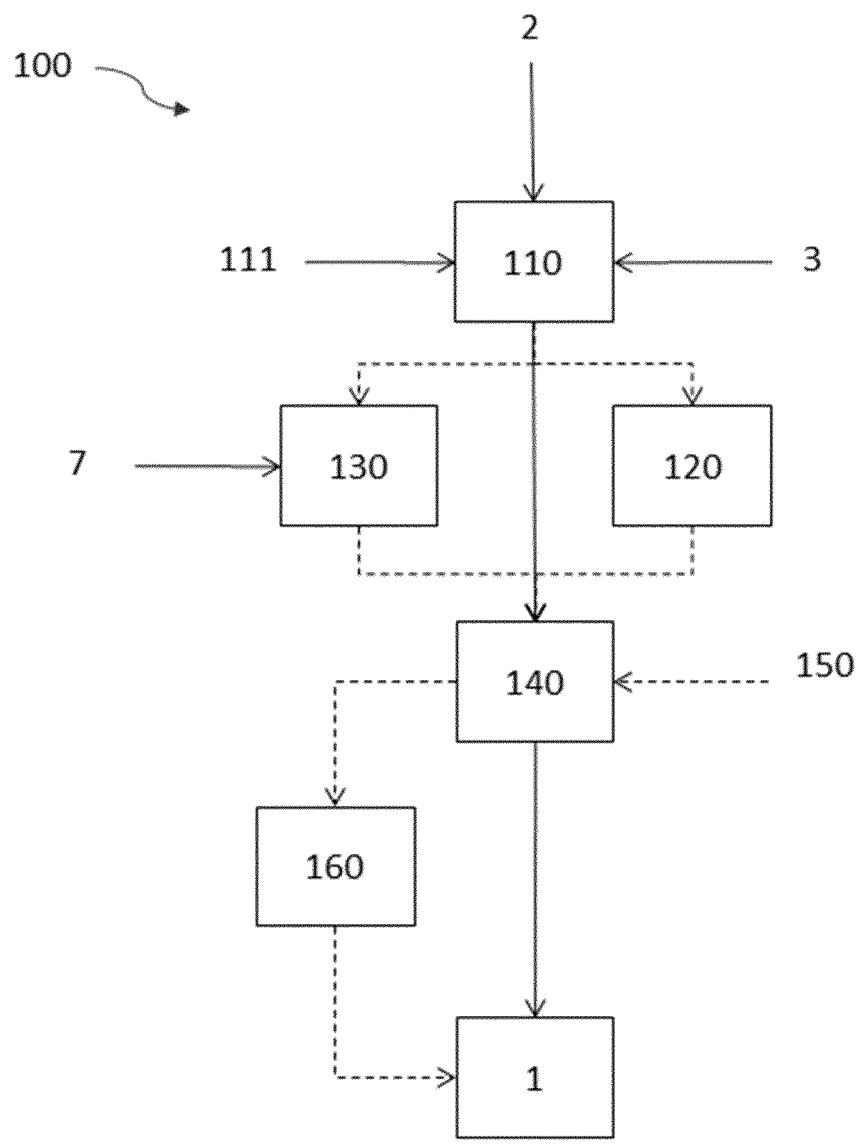

FIG. 5 shows a principal sketch of an embodiment of the method 100 according to the present invention to manufacture an array of light sources 1 comprising the steps of arranging 110 multiple VCSELs 2 on top of a substrate 3 in an lateral array 1, where each VCSEL 2 comprises a light emitting area 21 surrounded by an electrode structure 22 which does not emit light and applying 140 a shielding layer 4 at least on top of the electrode structure 22 to cover at least a surface 22s of the electrode structure 22 facing towards an average light emitting direction 5 of the VECSELs 2 in order to optically match the array 1 in a switched-off state to an outer surface 11s of a housing 11 of a device 10, where the array of light sources 1 is to be installed. The process for applying 140 the shielding layer on top of the electrode structure 22 can be any suitable process, e.g. a masking process shielding the light-emitting area 21 of the VCSELs 2 during deposition. Alternatively the method may comprise the step of covering 120 the light-emitting areas 21 with a photoresist material before applying 140 the shielding layer. The step of applying 140 the shielding layer 4 may also coat non-active areas 6 within the array 1 located between neighbored VCSELs 2. In an embodiment the method further comprises the step of suitably filling 130 volumes 61 between neighbored VCSELs 2 defined by the non-active areas 6 by a filler material 7 to provide a smooth surface 71 between neighbored VCSELs 2 to be coated with the shielding layer 4 in the applying step 140. The term suitable filling 130 may denote the filling of at least one volume 61 to a highest distance D1 of the electrode structures 22 of the neighbored VCSELs 2 above the substrate 3. In case of the light-emitting areas 21 being covered with a photoresist material before applying 140 the shielding layer, the photoresist layer covering the light-emitting areas 21 will be washed away 160 after having applied 140 the shielding layer 4 in order to remove any material on top of the light-emitting areas 21. In another embodiment with non-covered light emitting areas 21 the step of applying 140 the shielding layer 4 might be performed via a mask-less electrophoretic deposition process 150 in order to locally deposit the shielding layer 4 on top of the electrode structure 22. During this process 150 the array 1 of VCSELs 2 is arranged in a wet solution comprising the material of the shielding layer 4 to be deposited on top of the electrode structure 22 and electrical field is applied between solution and VCSEL electrode structures 22. The electrical field directs the to-be-deposited material to the areas with a high electrical field density, which is located close to the electrode structures 22. Especially the electrode structure 22 are the to-be-coated areas in order to be able to match the optical appearance of the array of light sources 1 to a required appearance, because these areas contribute to far more than 50% to the visible areas of the array 1. Therefore the material of the shielding layer 4 is mainly or exclusively deposited on top of the electrode structure 22 leaving the light-emitting areas 21 of the VCSELs 2 uncoated. With this electrophoretic process 150 the VCSELs 2 can be locally coated without applying a mask process or a layer hardening process. Therefore the electrophoretic deposition process 140 requires less effort compared to alternative deposition processes.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 1 array of light sources according to the present invention
2 vertical cavity surface emitting layer (VCSEL)
21 light emitting area of the VCSEL
22 electrode structure of the VCSEL surrounding the light emitting area of the VCSEL
22s surface of the non-emitting structure facing towards an average light emitting direction
22l surface of the non-emitting structure facing towards neighbored VCSELs substrate of the array
4 shielding layer
5 average light emitting direction of the VCSEL
6 non-active areas between neighbored VCSELs
61 volume between neighbored VCSELs defined by the non-active areas
7 filler material
71 smooth surface of the filler material
10 device comprising the array of light sources according to the present invention
11 housing of the device
11s outer surface of the housing
100 method to manufacture the array of light sources according to the present invention
110 Arranging multiple VCSELs on top of a substrate in an lateral array
120 covering the light-emitting areas with a photoresist material before applying the shielding layer
130 suitably filling volumes between neighbored VCSELs defined by the non-active areas
140 Applying a shielding layer at least on top of the electrode structure
150 performing a mask-less electrophoretic deposition process
160 washing away the photoresist layer after having applied the shielding layer
D1 highest distance of the non-light-emitting structures of the neighbored VCSELs above the substrate
P2, P3 cross section planes 2 and 3 for FIGS. 2 and 3, respectively
VD viewing direction

The invention claimed is:

1. An array of light sources comprising:
multiple vertical cavity surface emitting lasers (VCSELs) arranged laterally to each other on top of a substrate, wherein each of the multiple VCSELs comprises a light emitting area surrounded by an electrode structure which does not emit light,
wherein a shielding layer is applied on top of at least the electrode structure only covering a surface of the electrode structure facing towards an average light emitting direction of the multiple VCSELs, and
the shielding layer is an opaque layer and being adapted to optically match the array in a switched-off state, where no light is emitted, to a demanded appearance, preferably to an outer surface of a housing of a device where the array of light sources is to be installed.

2. The array of light sources in accordance with claim 1, wherein all visible surfaces of the electrode structure are coated by the shielding layer.

3. The array of light sources in accordance with claim 1, wherein the array of light sources comprise non-active areas between neighbored VCSELs of the multiple VCSELs, where the shielding layer also covers the non-active areas.

4. The array of light sources in accordance with claim 3, wherein the non-active areas define volumes between neighbored VCSELs, where at least the volumes are suitably filled by a filler material to provide a flat surface between neighbored VCSELs to be coated with the shielding layer, preferably the filler material is a photoresist material.

5. The array of light sources in accordance with claim 4, wherein the filler material fills out at least one volume to a highest distance of the electrode structures of the neighbored VCSELs above the substrate.

6. The array of light sources in accordance with claim 1, wherein the shielding layer has at least one of an absorption spectrum and a reflection spectrum within the visible wavelength range being different from a corresponding absorption spectrum and a corresponding reflection spectrum of a material of the electrode structure.

7. The array of light sources in accordance with claim 6, wherein the material of the electrode structure is gold.

8. A device comprising:
   at least one array of light sources including multiple VCSELs arranged laterally to each other on top of a substrate;
      wherein each VCSEL of the multiple VCSELs comprises a light emitting area surrounded by an electrode structure which does not emit light,
      wherein a shielding layer is applied on top of at least the electrode structure only covering a surface of the electrode structure facing towards an average light emitting direction of the multiple VCSELs, the shielding layer is an opaque layer and being adapted to optically match the array in a switched-off state, where no light is emitted, to a demanded appearance; and
   a housing with an outer surface, where the shielding layer optically matches the array in a switched-off state to the outer surface.

9. A method to manufacture an array of light source comprising:
   arranging multiple VCSELs on top of a substrate in a lateral array, where each VCSEL of the multiple VCSELs comprises a light emitting area surrounded by an electrode structure which does not emit light; and
   applying a shielding layer as an opaque layer at least on top of the electrode structure only covering a surface of the electrode structure facing towards an average light emitting direction of the multiple VCSELs in order to optically match the array in a switched-off state to a demanded appearance, preferably to an outer surface of a housing of a device where the array of light sources is to be installed.

10. The method in accordance to claim 9, wherein prior to the step of applying the shielding layer the method further comprises:
   covering each of the light-emitting areas with a photoresist material before applying the shielding layer; and
   washing away the photoresist material covering each of the light-emitting areas after having applied the shielding layer in order to remove any material on top of each of the light-emitting areas.

11. The method in accordance to claim 9, wherein the step of applying the shielding layer will also coat non-active areas within the array located between neighbored VCSELs.

12. The method in accordance to claim 11, wherein prior to the step of applying the shielding layer the method further comprises the step of suitably filling volumes between neighbored VCSELs defined by the non-active areas by a filler material to provide a flat surface between neighbored VCSELs to be coated with the shielding layer.

13. The method in accordance to claim 12, wherein suitable filling denotes the filling of at least one volume to a highest distance of the electrode structures of the neighbored VCSELs above the substrate.

14. The method in accordance to claim 9, wherein the step of applying the shielding layer is performed via a mask-less electrophoretic deposition process in order to locally deposit the shielding layer on top of the electrode structure.

* * * * *